(12) United States Patent
Karpov et al.

(10) Patent No.: US 7,098,058 B1
(45) Date of Patent: Aug. 29, 2006

(54) PHOTOVOLTAIC HEALING OF NON-UNIFORMITIES IN SEMICONDUCTOR DEVICES

(75) Inventors: Victor G. Karpov, Toledo, OH (US); Yann Roussillon, Mountain View, CA (US); Diana Shvydka, Toledo, OH (US); Alvin D. Compaan, Holland, OH (US); Dean M. Giolando, Toledo, OH (US)

(73) Assignee: University of Toledo, Toledo, OH (US)

( * ) Notice: Subject to any disclaimer, the term of this patent is extended or adjusted under 35 U.S.C. 154(b) by 78 days.

(21) Appl. No.: 11/035,170

(22) Filed: Jan. 13, 2005

Related U.S. Application Data

(60) Provisional application No. 60/536,673, filed on Jan. 15, 2004.

(51) Int. Cl.
*H01L 21/00* (2006.01)

(52) U.S. Cl. ............................ 438/22; 257/79

(58) Field of Classification Search ............ 438/4, 438/22, 88, 95, 96; 257/79, 80, 113
See application file for complete search history.

(56) References Cited

U.S. PATENT DOCUMENTS

| | | | |
|---|---|---|---|
| 4,385,971 A | 5/1983 | Swartz | |
| 4,598,306 A | 7/1986 | Nath et al. | |
| 5,084,400 A | 1/1992 | Nath et al. | |
| 6,291,763 B1 * | 9/2001 | Nakamura | 136/256 |

FOREIGN PATENT DOCUMENTS

JP          60085576          5/1985

OTHER PUBLICATIONS

V. G. Karpov, Diana Shvydka, Yann Roussillon, and A. D. Compaan, "The Mesoscale Physics of Large-Area Photovoltaics", Proceedings of 3d World Conference on Photovoltaic Energy Conversion, Osaka, Japan, May 11-18, 2003 (note: there are no page numbers assigned).

V. G. Karpov, A. D. Compaan, and Diana Shvydka, "Micrononuniformity Effects in Thin-Film Photovoltaics", Proceedings of 29th IEEE Photovoltaic Specialists Conference, New Orleans, May 18-23, 2002, pp. 708-711.

V. G. Karpov, R. Harju, and G. Dorer, "Non-Uniform Power Generation in Polycrystalline Thin-Film Photovoltaics", Procceedings of 27th IEEE Photovoltaic Specialists Conference, Alaska, 2000, pp. 547-550.

(Continued)

*Primary Examiner*—Phuc T. Dang
(74) *Attorney, Agent, or Firm*—MacMillan, Sobanski & Todd, LLC

(57) ABSTRACT

A method of making a photovoltaic device using light energy and a solution to normalize electric potential variations in the device. A semiconductor layer having nonuniformities comprising areas of aberrant electric potential deviating from the electric potential of the top surface of the semiconductor is deposited onto a substrate layer. A solution containing an electrolyte, at least one bonding material, and positive and negative ions is applied over the top surface of the semiconductor. Light energy is applied to generate photovoltage in the semiconductor, causing a redistribution of the ions and the bonding material to the areas of aberrant electric potential. The bonding material selectively bonds to the nonuniformities in a manner such that the electric potential of the nonuniformities is normalized relative to the electric potential of the top surface of the semiconductor layer. A conductive electrode layer is then deposited over the top surface of the semiconductor layer.

28 Claims, 10 Drawing Sheets

OTHER PUBLICATIONS

D. Rose, R. Powell, U. Jayamaha, and M. Maltby, "Advances in Performance and High-Throughput Manufacturing of Thin-Film CdTe/CdS Modules", Proceedings of the 29th IEEE Photovoltaic Specialists Conference, New Orleans, LA, May 18-22, 2002, IEEE, New York, 2002, pp. 555-558.

* cited by examiner

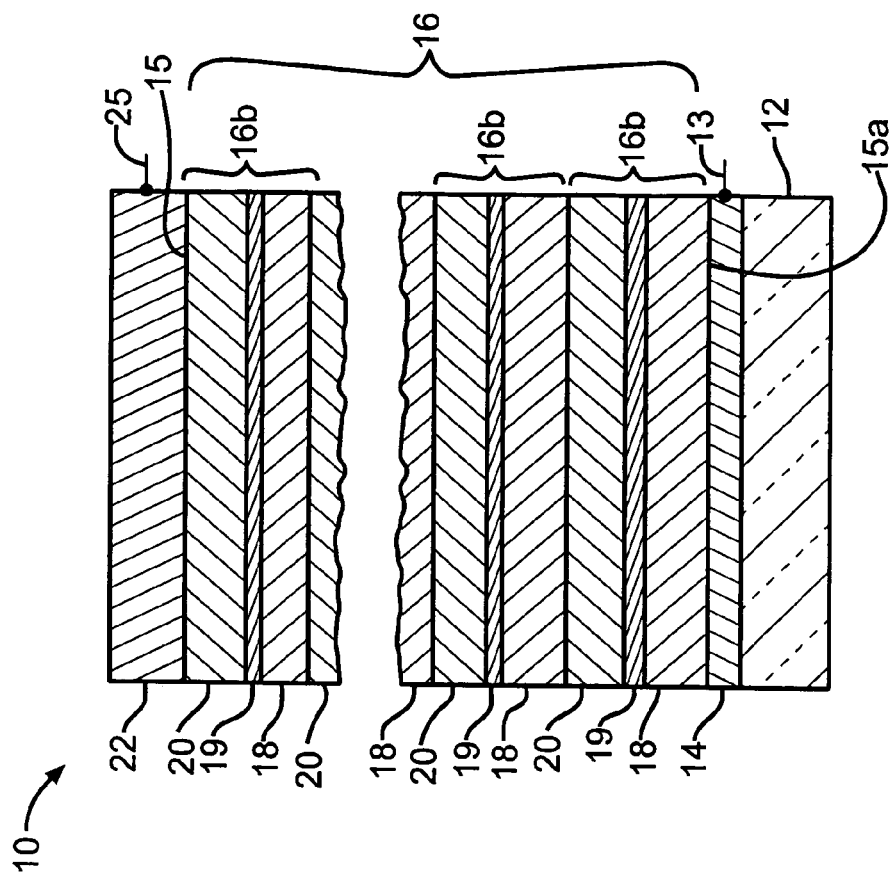
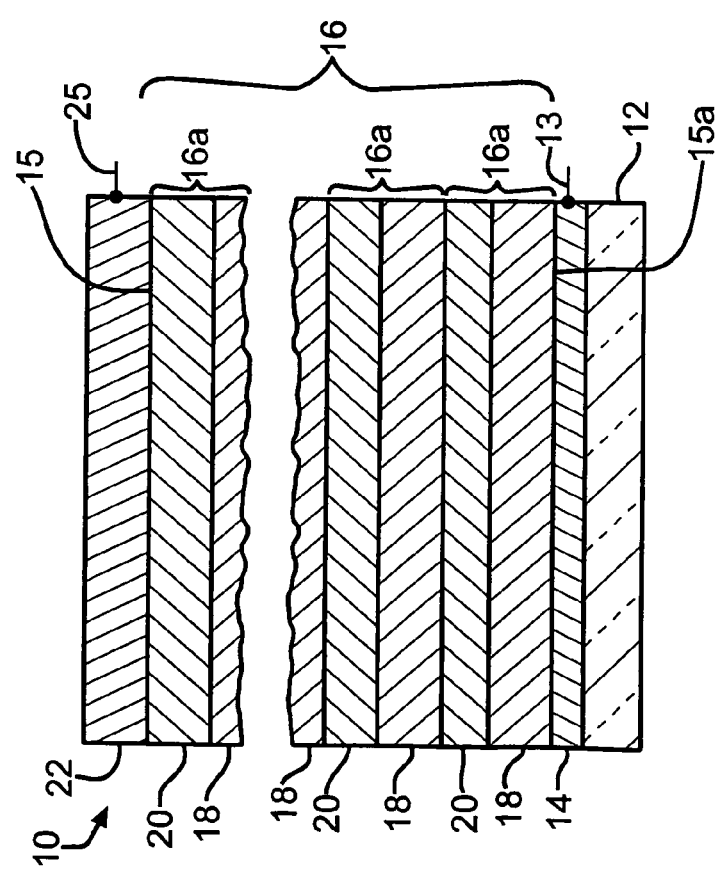

PHOTOVOLTAIC HEALING OF NON-UNIFORMITIES IN SEMICONDUCTOR DEVICES

CROSS REFERENCE TO RELATED APPLICATION

This application claims the benefit of U.S. Provisional Application No. 60/536,673, filed Jan. 15, 2004, the disclosure of which is incorporated herein by reference.

GOVERNMENT INTERESTS

The United States Government has certain rights in this invention pursuant to Contract No. NERL-NDJ-1-30630-02 awarded by the U.S. Department of Energy.

TECHNICAL FIELD

The present invention concerns semiconductor devices and a method of manufacturing semiconductor devices. More particularly, this invention relates to a method of manufacturing a semiconductor junction structure that includes selectively creating an electrically modified layer over areas of aberrant electric potential that deviate from the average electric potential in a semiconductor or electrode layer of a semiconductor device.

BACKGROUND OF THE INVENTION

Thin film semiconductor structures have recently found increasing popularity in industries requiring large active area semiconductor devices, such as the terrestrial photovoltaic, light emitting panel, and liquid crystal display driver fields. All of the above fields may incorporate devices having a photovoltaic cell type structure that generates a photovoltaic effect by generating voltage in response to absorbed light energy.

A typical photovoltaic (PV) cell includes a substrate layer for mounting the cell and two ohmic contacts or conductors for passing current to an external electrical circuit. The cell also includes an individual multi-layer semiconductor cell or several semiconductor cells connected in series. The cells operate by having readily excitable electrons that can be energized by solar energy to higher energy levels, thereby creating positively charged holes and negatively charged electrons at the interface of various semiconductor layers. The creation of these positive and negative charge carriers applies a net voltage across a base electrode layer and a top electrode layer positioned on either side of the semiconductor layer of the PV cell, which can force a current of electricity when the device is connected to a proper electric circuit.

The application of semiconductor devices in industries such as those mentioned above has created a need for semiconductor devices having active area requirements extending up to approximately one square meter. Due to these size requirements, the use of polycrystalline or amorphous thin film semiconductor material layers has become increasingly popular in semiconductor device design, as opposed to known crystalline semiconductor structures, which are both limited in size and expensive to manufacture. However, inherent in such polycrystalline or amorphous thin film layer semiconductor device configurations is the presence of various structural nonuniformities. Where a PV cell structure is used, these structural nonuniformities can cause lateral fluctuations in the electric potential at the surfaces of the various layers of the PV device (areas of low electric resistance are often referred to as shunts) as well as cause forward current leakage paths (often referred to as weak diodes). The structural nonuniformities can result from either defects within various semiconductor layers of the device or from morphological irregularities in the deposition surface of the substrate material. These defects lead to an overall decrease in the efficiency of the semiconductor device.

In order to minimize the negative impact such structural nonuniformities have on the performance of a PV device, there are a number of known treatment or minimization methods that effectively disable the semiconductor defect regions by destroying or isolating the corresponding defect region present in one of the electrode layers of the PV device. For example, U.S. Pat. No. 5,084,400 to Nath et al. discloses a method of using an activated conversion reagent to alter the physical properties of a top metal electrode layer to make highly resistive the areas of the top metal electrode layer surrounding low resistance current paths of the PV device caused by the surface nonuniformities of the semiconductor layer. Another known method, disclosed by U.S. Pat. No. 4,385,971 to Swartz, involves electrolytically etching or removing the corresponding top metal electrode material surrounding the semiconductor nonuniformity regions. Japanese Patent 60085576 to Fuse discloses a method of anodizing areas of a base metal electrode layer exposed through defects in the semiconductor layer to a non-conductive state prior to the application of the top electrode layer to prevent short circuit paths in the PV cell.

Another known method for minimizing the effects of nonuniformities in PV cells is the application of a barrier layer over a semiconductor surface containing surface nonuniformities. The application of such a barrier layer blocks the undesired electrical contact with the defect areas and minimizes electrical path failures to improve the overall operating efficiency of the PV cell. For example, U.S. Pat. No. 4,598,306 to Nath et al. discloses a continuous transparent barrier layer disposed between the semiconductor region and one of the electrode layers of the PV device. The barrier layer is disposed across the entire surface of the semiconductor and is formed from a specific group of materials designed to increase the resistivity of shunt (low resistance) regions on the semiconductor surface, which limits the flow of current through the short circuit current path of the shunt.

Even in light of the known methods for minimizing the effects of structural nonuniformities in PV cells utilizing thin-film semiconductor devices, there remains a continuing need for a more efficient, less expensive, and longer lasting thin-film semiconductor device. Thus, it would be advantageous to develop an improved method for treating structural nonuniformities in semiconductor devices that modifies the electric potential of localized defect areas within the semiconductor device to create a more uniform distribution of the electric potential generated by the semiconductor device.

SUMMARY OF THE INVENTION

The above objects as well as other objects not specifically enumerated are achieved by a method for treating structural nonuniformities in semiconductor devices that modifies the electric potential of localized defect areas within the semiconductor device to create a more uniform distribution of the electric potential generated by the semiconductor device.

A typical photovoltaic (PV) device structure is a PV cell. A typical PV cell generally includes a substrate layer having a base electrode material deposited thereon. An individual multi-layer semiconductor cell or several semiconductor cells connected in series is deposited over the base electrode layer. A conductive electrode layer is then placed over the semiconductor layer. The cells of the semiconductor layer operate to create a net voltage across the base electrode layer and conductive electrode layer positioned on either side of the semiconductor layer of the PV cell.

Thin film semiconductor devices generally contain a plurality of structural nonuniformities within the semiconductor layer. These structural nonuniformities effect the performance of the PV cell because areas of aberrant electric potential corresponding to these nonuniformities are created at the top surface of the semiconductor layer. The areas of aberrant electric potential deviate from the average electric potential of the remainder of the top surface of the semiconductor layer, which can lead to a decrease in the performance of the PV cell due to the variations in electric potential at the top surface of the semiconductor layer.

According to the method of this invention, a combination of light energy and a chemical solution is used to normalize the electric potential variations caused by surface nonuniformities in the semiconductor layer of the PV device. In a first embodiment of the invention, the top surface of the semiconductor layer is treated prior to the application of the conductive electrode layer. A solution is applied to the top surface of the semiconductor layer. The solution is generally comprised of an electrolyte and one or more bonding materials. Preferably, the solution has electrochemical properties, and more preferably includes a combination of an aniline material, p-toluenesulphonic acid, and sodium chloride (NaCl) in a deionized water base. The electrolyte component of the solution provides positive and negative ions within the solution. These positive ions can act as carriers for the non-ionic bonding material during the treatment process, as the non-ionic bonding material attaches to the positive and negative ions within the solution.

In a next step of the method, light energy is applied to the semiconductor layer of the PV device. The light energy generates a photovoltage in the semiconductor layer. The photovoltage enhances the deviation in the electric potential of the aberrant electric potential areas caused by the non-uniformities of the semiconductor layer. The generation of the photovoltage also causes an electrochemical reaction between the semiconductor layer and the solution. This electrochemical reaction causes a redistribution of the positive and negative ions of the solution, which carry the bonding material of the solution to the areas of aberrant electric potential caused by the nonuniformities in the semiconductor layer. The electrochemical reaction then causes the bonding material to bond to the top surface of the semiconductor layer. The resultant bonding is selective bonding of the bonding material to the areas of aberrant electric potential. This selective bonding of the bonding material normalizes the electric potential of the nonuniformities relative to the average electric potential of the remainder of the top surface of the semiconductor layer. A conductive electrode layer is then deposited over the treated top surface of the semiconductor layer to complete the PV device.

The net result of the selective deposition of the bonding material is the normalization of the overall average surface photovoltage of the semiconductor layer. This normalization of the surface photovoltage of the semiconductor layer can increase the performance of the PV device. Additionally, the normalization of the surface photovoltage increases the stability of the PV device. Stability is increased by reducing the stresses caused by the nonuniformities in the semiconductor layer, which slows nonuniform degradation of the PV device.

In a second embodiment of the invention, the PV device can be treated after the application of the conductive electrode layer to the top surface of the semiconductor layer. Where treatment is applied to the conductive electrode layer, the conductive electrode layer must generally be formed from a transparent conductive electrode material. When a transparent conductive electrode layer is applied to an untreated semiconductor layer, the areas of aberrant electric potential at the top surface of the semiconductor cause corresponding defect areas of aberrant electric potential in the conductive electrode layer.

According to the second embodiment of the method, a solution is applied over the transparent conductive electrode layer. The solution used preferably has the same chemical parameters and characteristics as the solution used in the first embodiment of the invention. Following the application of the solution, light energy is applied to the semiconductor layer. The light energy enhances the deviation in the electric potential of the aberrant electric potential areas in both the semiconductor layer and the transparent conductive electrode layer. The enhancement of the deviations prompts an electrochemical reaction between the solution and transparent conductive electrode layer. As in the first embodiment, the electrochemical reaction causes a redistribution of the positive and negative ions of the solution. The electrochemical reaction also causes the bonding material carried by the positive and negative ions to bond to the top surface of the transparent conductive electrode layer. The resultant bonding is selective bonding of the bonding material to the areas of aberrant electric potential of the transparent conductive electrode layer. This selective bonding of the bonding material normalizes the electric potential of the defect areas relative to the average electric potential of the remainder of transparent conductive electrode layer.

Various objects and advantages of this invention will become apparent to those skilled in the art from the following detailed description of the preferred embodiment, when read in light of the accompanying drawings.

BRIEF DESCRIPTION OF THE DRAWINGS

FIGS. 2 and 3 are schematic elevational views of a tandem photovoltaic cell having a multi-junction semiconductor layer formed from a plurality of individual semiconductor cells that may be treated using the method of the present invention.

DETAILED DESCRIPTION OF THE INVENTION

Figure 1:
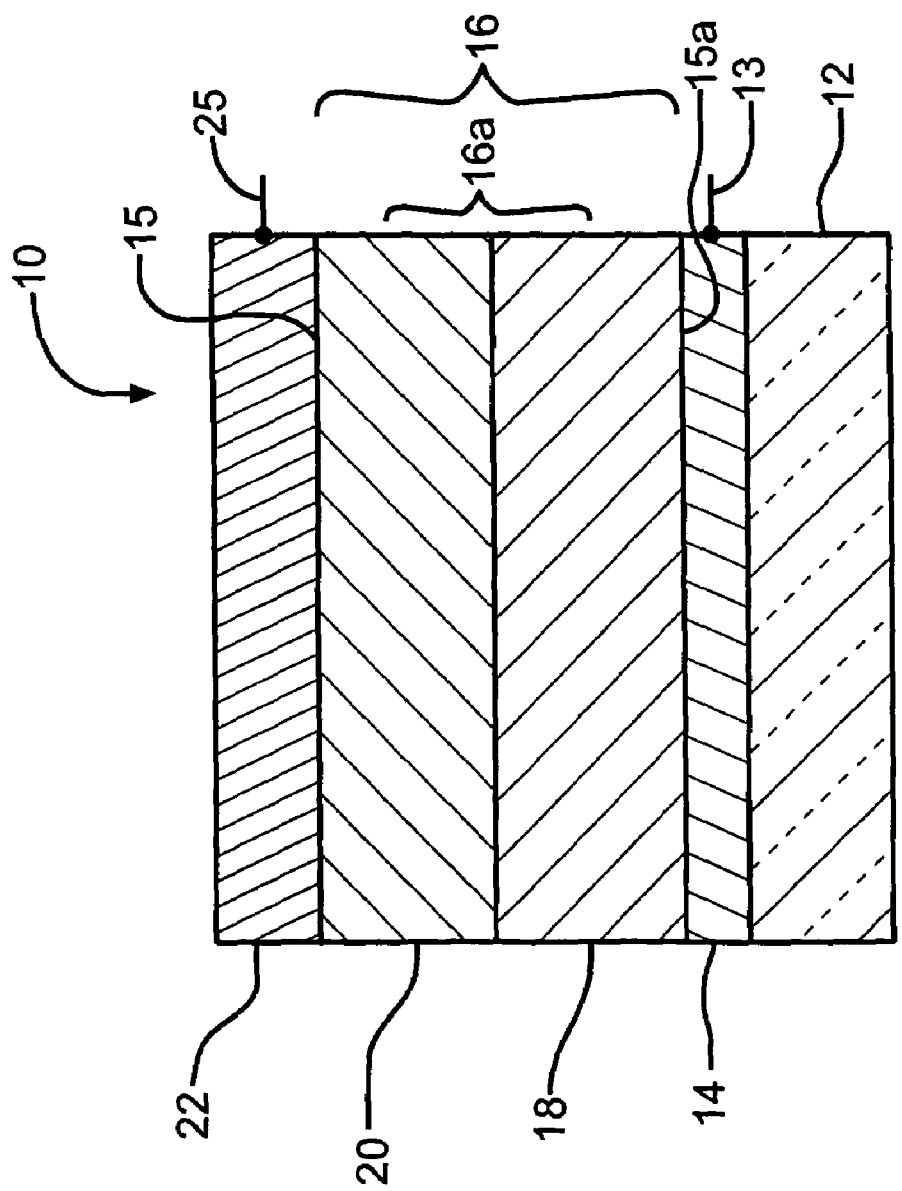
FIG. 1 is a schematic elevational view of a photovoltaic cell having a single junction semiconductor layer.

Referring now to the drawings, there is shown in FIGS. 1 through 3 photovoltaic cell configurations, indicated generally at 10, having semiconductor device and semiconductor junction structures that may be manufactured according to the method of the present invention. The illustrated configurations for the photovoltaic cells 10 are, in large measure, conventional in the art and are intended merely to illustrate general photovoltaic cell configurations in which this invention may be used. It will also be appreciated that the method of the present invention may be utilized in the manufacture of any apparatus that includes a semiconductor device used to generate voltage in response to absorbed light energy, such as light emitting diode arrays or liquid crystal display drivers. Thus, the scope of this invention is not intended to be limited to either photovoltaic cells in general or to the specific structures for the photovoltaic cells 10 illustrated in FIGS. 1 through 3.

The photovoltaic cell 10 includes a substrate layer 12. Preferably this substrate layer 12 is a transparent material, such as glass, but it will be appreciated that other transparent materials can also be used. It will also be appreciated that an opaque substrate material, such as metal, may also be used. A base electrode layer 14 is applied to the substrate layer 12. The base electrode layer 14 can be composed of either a transparent conductive material, such as a transparent conductive oxide, or a non-transparent conductive material, such as a metallic material. Where a transparent conductive material is used, preferably a transparent conductive oxide material such as a fluorine-doped tin oxide ($SnO_2$:F) is used. It will also be appreciated that any suitable transparent conductive oxide material may also be used. This base electrode layer 14 forms one of the two ohmic contacts or electrodes for the photovoltaic cell 10, and contains a conductive lead 13 for conducting current through an electric circuit (not shown).

The semiconductor layer, indicated generally at 16, is applied over the base electrode layer 14. The semiconductor layer 16 is comprised of at least one individual semiconductor cell, which may be configured in any suitable manner. FIG. 1 illustrates a simple PV cell design including a semiconductor cell 16a, which is comprised of two layers (often referred to as a single junction semiconductor cell). The first layer of the semiconductor cell 16a is comprised of an n-type semiconductor material 18. In a preferred embodiment of the invention this n-type semiconductor material is cadmium sulfide (CdS), although it will be appreciated that any suitable n-type semiconductor material may also be used. The next layer of the semiconductor cell 16a is comprised of a p-type semiconductor material 20. In a preferred embodiment of the invention this p-type semiconductor material is cadmium telluride (CdTe), although it will be appreciated that any suitable p-type semiconductor material may also be used. FIGS. 2 and 3 illustrate tandem PV cells having a multi-junction semiconductor layer 16, which is comprised of a plurality of individual semiconductor cells 16a, 16b. As shown in FIG. 2, the individual semiconductor cells may be of the single junction, two-layer cell type 16a described above with reference to FIG. 1. Alternatively, FIG. 3 shows a multi-junction semiconductor layer 16 comprised of a plurality of three-layer (often referred to as double junction) cells 16b. The individual three-layer semiconductor cells 16b are comprised of an n-type semiconductor layer 18, a p-type semiconductor layer 20, and also include an intrinsic (i-type) semiconductor layer 19 disposed between the p-type semiconductor layer 20 and the n-type semiconductor layer 18. It will also be appreciated that the simple PV cell 10 illustrated in FIG. 1 may also be constructed using an individual double-junction type semiconductor cell 16b shown in FIG. 3. The individual thin-film layers of the semiconductor layer 16 may be applied to the substrate layer 12 using any suitable application method, such as by vapor transport deposition or by sputtering techniques.

To complete the PV cells 10 shown in FIGS. 1 through 3, a conductive electrode layer 22 is deposited onto the top surface 15 of the semiconductor layer 16. The top surface 15 of the semiconductor layer 16 is the surface of the semiconductor layer 16 disposed opposite the surface 15a of the semiconductor layer 16 applied to the base electrode layer 14. The conductive electrode layer 22 serves as the second of the two ohmic contacts or electrodes for the photovoltaic cell 10. The conductive electrode layer 22 contains a conductive lead 25 for conducting current through the electric circuit (not shown). The conductive electrode layer 22 can be composed of either a transparent conductive material, such as a transparent conductive oxide, or a non-transparent conductive material, such as a metallic material. Generally, only one of the base electrode layer 14 or the conductive electrode layer 22 is formed from a transparent conductive material, with the remaining electrode layer being formed from a non-transparent material. Therefore, in a preferred embodiment where a transparent conductive material is used for the base electrode layer 14, a non-transparent material is used for the conductive electrode layer 22. Examples of such suitable non-transparent materials for the conductive electrode layer 22 include nickel, titanium, chromium, or aluminum. It will be appreciated, however, that the base electrode layer 14 and the conductive electrode layer 22 may be formed using any suitable materials that allow for light to be absorbed into the semiconductor layer 16 through at least one of the electrode layers 14, 22. Both the base electrode layer 14 and the conductive electrode layer 22 may be applied to the PV cell 10 using any suitable thin-film application method, such as sputtering techniques.

Figure 4:
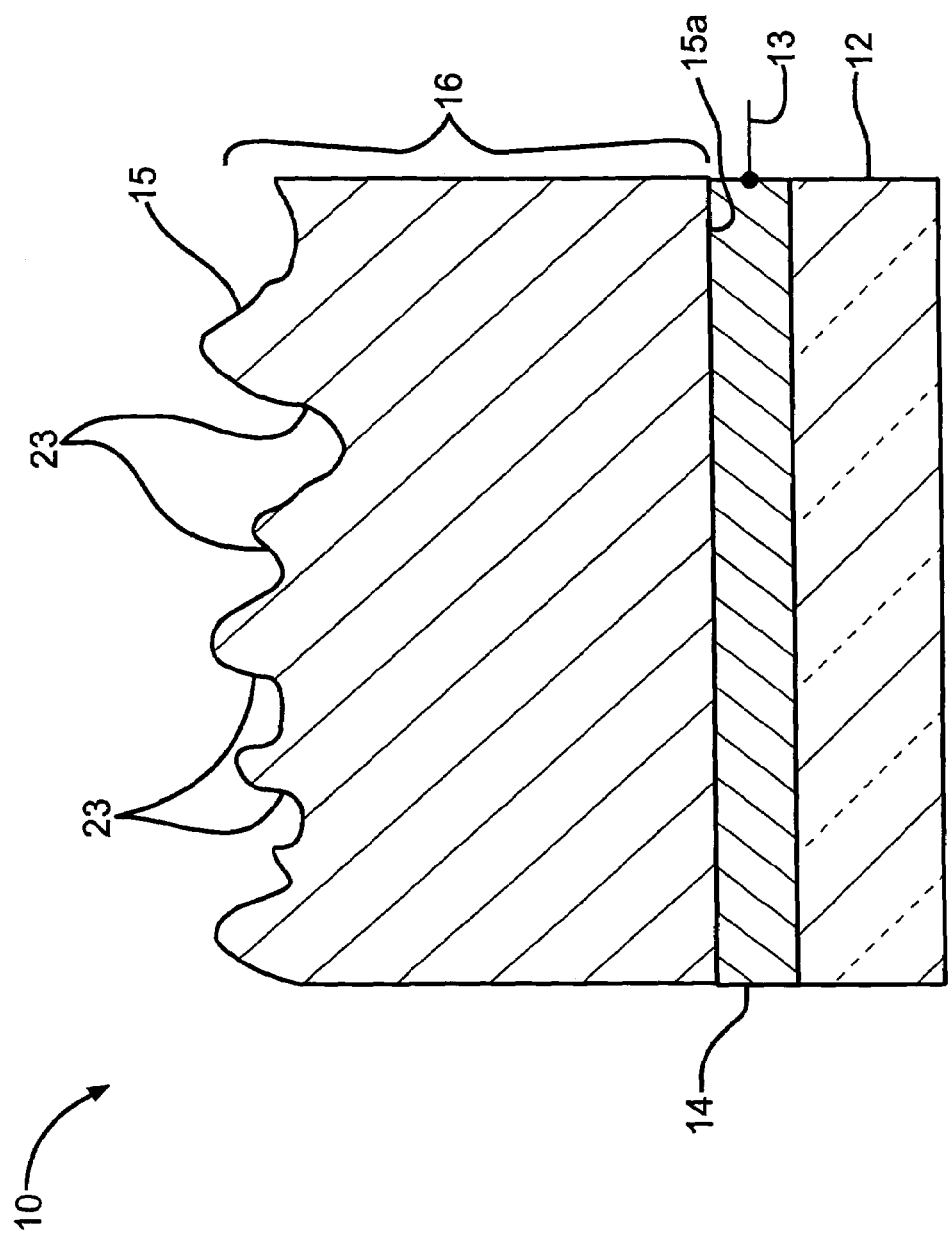
FIG. 4 is a schematic elevational view of a portion of a photovoltaic cell illustrating nonuniformities present in the semiconductor layer.

In both simple and multi-junction PV cell designs, a number of structural nonuniformities or defects exist throughout the semiconductor layer 16 of the PV cell 10. These defects can occur for numerous reasons, and can include such defects as irregularities caused by the deposition process used to form the various semiconductor layers or defects caused by morphological irregularities in the deposition surface of the substrate material 12. As shown in FIG. 4, the defects throughout the various semiconductor cells 16a, 16b result in nonuniformities 23, which cause areas of aberrant electric potential in the top surface 15 of the semiconductor layer 16. The areas of aberrant electric potential caused by the nonuniformities 23 deviate from the average electric potential of the remainder of the top surface 15 of the semiconductor layer 16. These areas of aberrant electric potential caused by the nonuniformities 23 can cause a decrease in the performance of the PV cell 10. It will be appreciated that the peaks and valleys illustrated on the top surface 15 of FIGS. 4 through 6 and 8 through 9 illustrate these areas of aberrant electric potential caused by the nonuniformities 23 and do not represent an actual variation in the thickness of the semiconductor layer 16 or conductive electrode layer 22. It will further be appreciated that the areas of aberrant electric potential caused by the nonuniformities 23 in FIGS. 4, 5, 8, and 9 have been exaggerated to show the enhancement of the variations in electric potential that occurs by the application of light energy to the semiconductor layer 16. Prior to the application of light energy, the areas of aberrant electric potential caused by the nonuniformities 23, although present, are generally less pronounced. The application of light energy to the semiconductor layer 16 will be explained in greater detail below.

During operation of the PV cell 10, light in the visible spectrum that is applied through the transparent electrode layer 14 or 22 travels to the semiconductor layer 16, where the light is largely absorbed. For example, where the base electrode layer 14 is comprised of a transparent conductive material, light is applied through the base electrode layer 14 and travels to the semiconductor layer 16; conversely, where the base electrode layer 14 is comprised of a non-transparent material, light is applied through the conductive electrode layer 22, which is formed from a transparent conductive material, and travels to the semiconductor layer. The fields created at the semiconductor junctions within the semiconductor layer 16 causes a voltage to be applied across the two electrode layers 14 and 22, thereby causing a current to flow through the external circuit. The nonuniformities 23 of the top surface 15 of the semiconductor layer 16 compromise the flow of current through the circuit, as areas of decreased electric potential can cause short circuit and forward current leakage paths in the PV cell 10, as discussed above. Similarly, areas of fluctuating electric potential (increasing and decreasing) create localized stresses within the semiconductor layer 16, which can cause non-uniform degradation of the PV cell 10.

Figure 5:
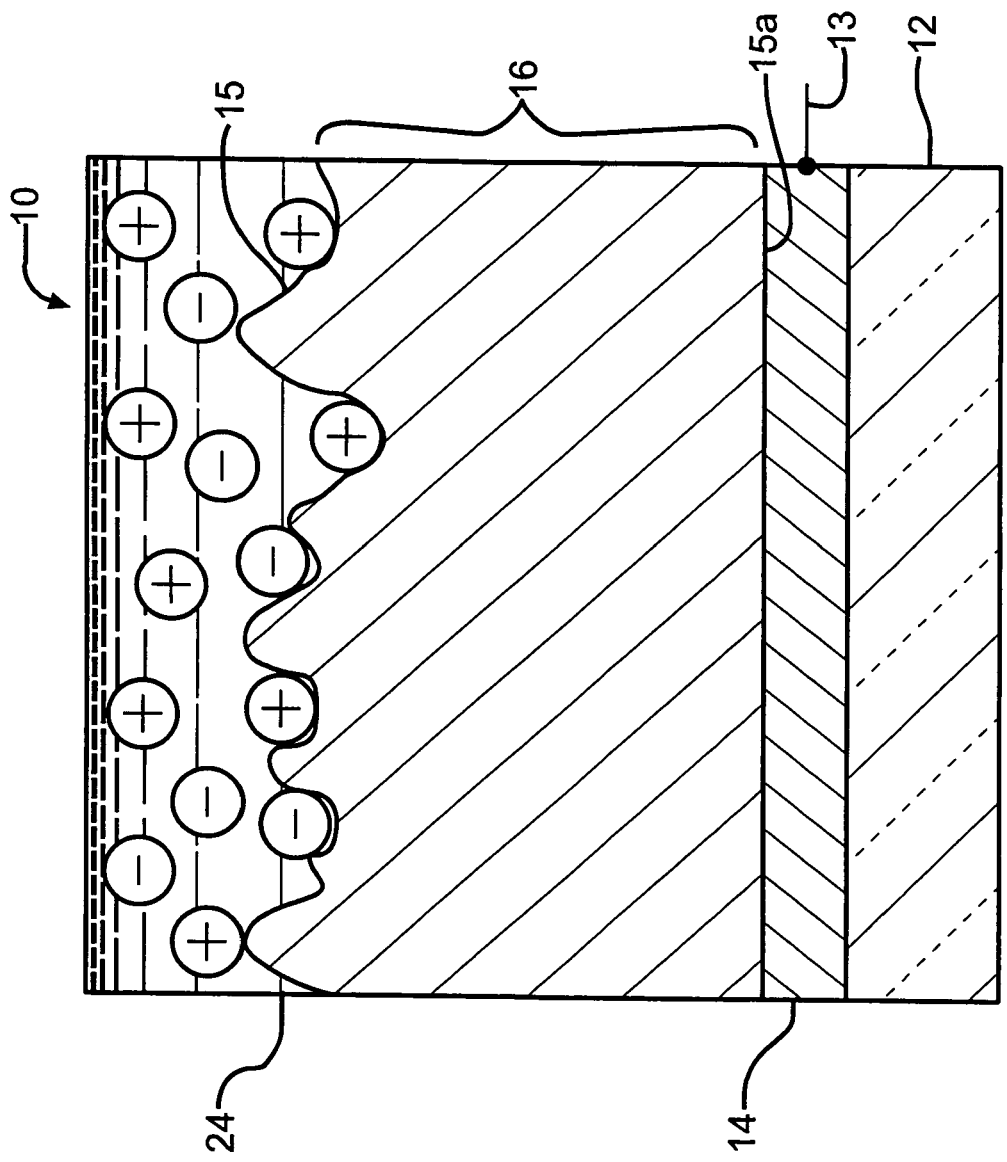
FIG. 5 is a schematic elevational view illustrating the application of a solution to the semiconductor layer in accordance with the method of the present invention.
Figure 6:
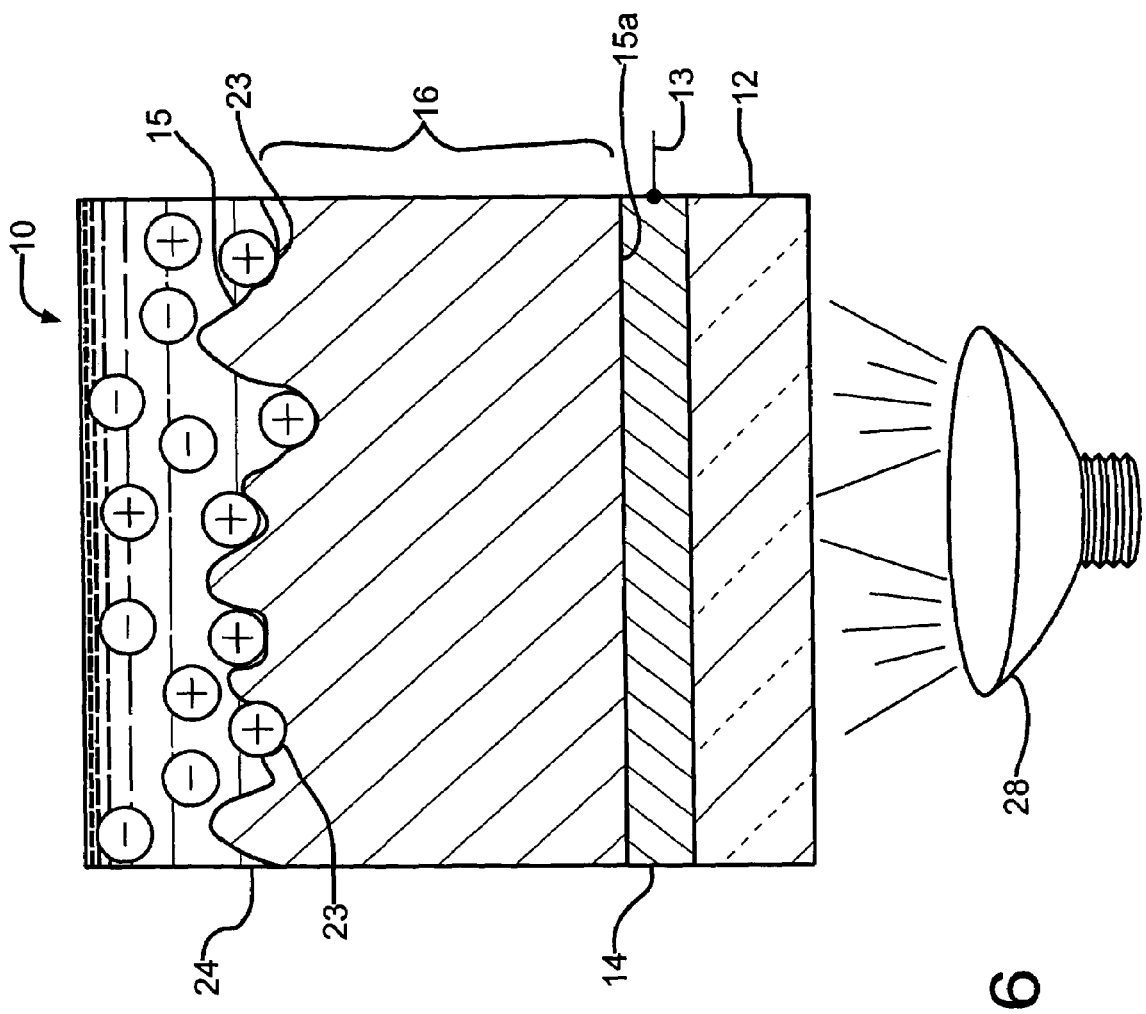
FIG. 6 is a schematic elevational view illustrating the application of light energy to the photovoltaic cell in accordance with the method of the present invention.
Figure 7:
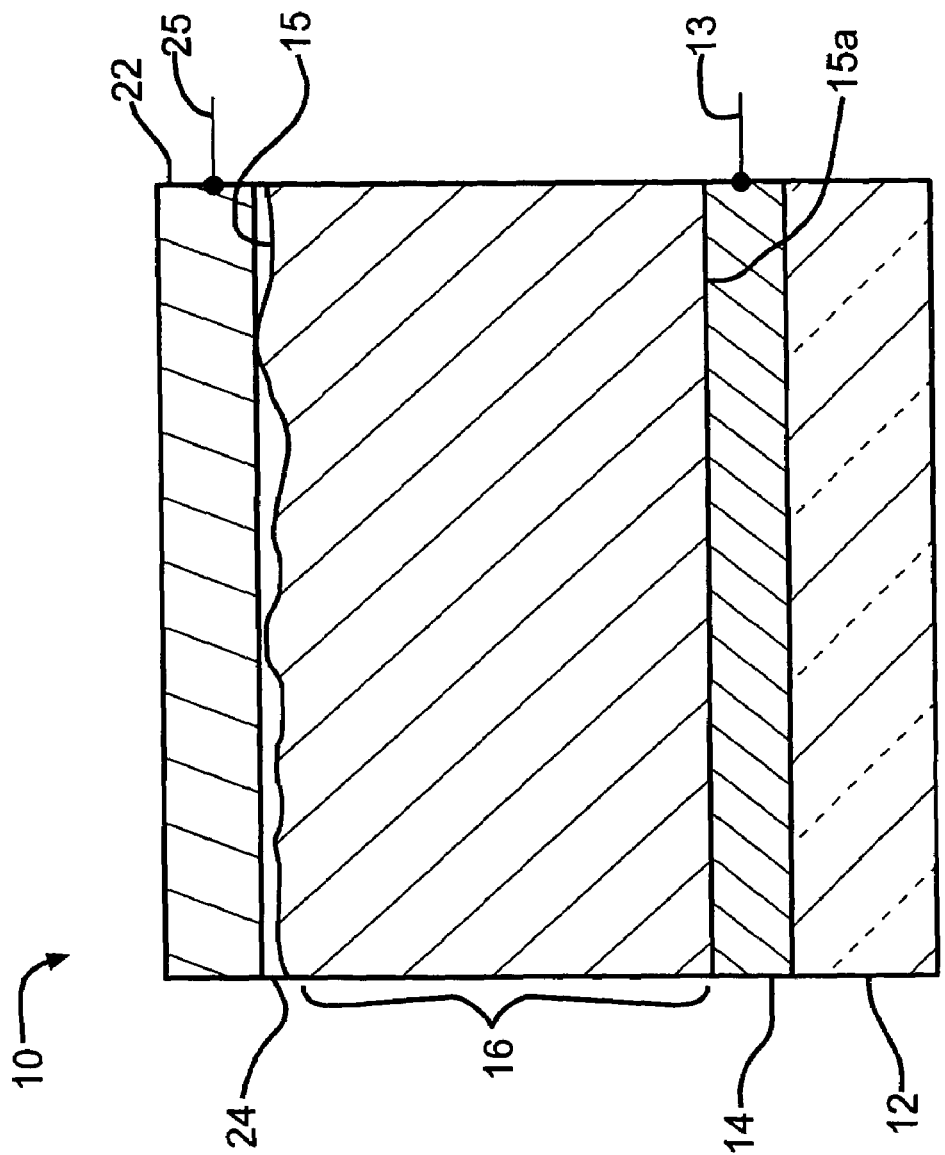
FIG. 7 is a schematic elevational view of a completed photovoltaic cell treated in accordance with the method of the present invention.

As shown in FIGS. 5 through 7, the method of the present invention uses a combination of light energy 28 and the application of a solution 24 containing both an electrolyte and at least one bonding and/or etching material to normalize, or level out, the surface potential variations caused by the nonuniformities 23 in the top surface 15 of the semiconductor layer 16. The application of light energy 28 is needed to generate a surface photovoltage in the semiconductor layer 16. This surface photovoltage causes a redistribution of the ions in the solution 24. The redistribution of the ions carries the bonding material of the solution 24 to the areas of aberrant electric potential on the top surface 15 of the semiconductor layer 16 and causes an electrochemical reaction between the semiconductor layer 16 and the solution 24. Depending upon the chemicals in the solution 24, the electrochemical reaction causes the selective deposition of the bonding material over the areas of aberrant electric potential caused by the nonuniformities 23 in the top surface 15 of the semiconductor layer 16. This selective deposition may include selectively etching and/or depositing local surface "clogs" of bonding material at the areas of aberrant electric potential of the semiconductor layer 16. These surface modifications can be electrically insulating or otherwise active (electric double layer, etc.), which causes a blockage (passivation) of the areas of aberrant electric potential. The blockage of the areas of aberrant electric potential blocks the effects of the nonuniformities 23 on device performance after subsequent deposition of the conductive electrode layer 22. This process can be described generally as a "self-healing" process of the nonuniformities 23 of the semiconductor layer 16 to reflect the fact that the process selectively acts to deposit the bonding material over only the weak spots of the PV device 10.

The process for normalizing the surface potential variations described above requires applying the solution 24 prior to the application of the conductive electrode layer 22. As shown in FIGS. 8 through 11, the process may also be used after the deposition of the conductive electrode layer 22 to selectively deposit the bonding material over defect areas 27 of aberrant electric potential in the conductive electrode layer 22. These defect areas 27 correspond to the surface nonuniformities 23 of the semiconductor layer 16. Treatment following the application of the conductive electrode layer 22 is generally possible only when the sheet resistance of the conductive electrode 22 is high enough to keep the surface potential nonuniformities 23 electrically isolated. In order to meet this resistance criterion, the conductive electrode layer 22 is generally comprised of a transparent conductive oxide material.

The treatment of the semiconductor layer 16 according to the first embodiment of the invention will now be described in more detail. FIGS. 4 through 7 illustrate the treatment of the semiconductor layer 16 with the solution 24 prior to the application of the conductive electrode layer 22. The configuration of the PV cell 10 to be treated is shown in FIG. 4. When the semiconductor layer 16 is treated prior to the application of the conductive electrode layer 22, preferably both the substrate layer 12 and the base electrode layer 14 are composed of transparent materials to allow for the application of light energy to the semiconductor layer 16 through the substrate 12 and the base electrode layers 14. More preferably, a glass substrate layer 12 coated with a fluorine-doped tin oxide ($SnO_2$:F) base electrode layer 14 is used. However, it will also be appreciated that either or both of the substrate layer 12 and the base electrode layer 14 may be comprised of an opaque material, such as a metallic material. Where an opaque material is used, light energy is applied directly to the top surface 15 of the semiconductor layer 16 during the treatment process, as will be explained in greater detail below.

As shown in FIG. 5, a solution 24 containing an electrolyte and one or more bonding materials is applied to the top surface 15 of the semiconductor layer 16. Preferably, the solution 24 has electrochemical properties, and more preferably includes a combination of an aniline material, p-toluenesulphonic acid, and sodium chloride (NaCl) in a deionized water base. Aniline material is used based on its ability to electropolymerize in acidic media at low electric potentials that are comparable to the surface photovoltage fluctuations caused by the areas of aberrant electric potential of the semiconductor layer 16. It will be appreciated that the solution 24 may also be formed from any suitable alternate chemical formulations that contain a material with electrochemical properties.

The electrolyte component of the solution 24 provides positive and negative ions within the solution 24. It will be appreciated, however, that the term "ion" as used throughout the application may refer to both simple ions provided by the electrolytic media portion of the solution 24 alone as well as electrolyte ions that carry the non-ionic bonding material(s) included within the solution 24. For example, the term "ion" as used in the preferred embodiment refers to the combination of the sodium chloride (NaCl) electrolyte ion having the aniline material of the solution 24 attached thereon. The importance of the positive and negative ions and their distribution within the solution 24 will be explained in greater detail below.

The electrolytic media component provides a solution resistivity to the solution 24. This resistivity of the solution 24 is preferably of a magnitude sufficient to cause the redistribution of the positive and negative ions of the solution 24 during the electrochemical reaction between the solution 24 and the semiconductor layer 16. This redistribution of ions is necessary to carry the bonding material to the areas of aberrant electric potential corresponding to the nonuniformities 23 on the top surface 15 of the semiconductor layer 16. Preferably, the resistivity of the solution 24 is within the range of from about 0.1 to about 2000 $\Omega$cm, and is more preferably within the range of from about 0.1 to about 10 $\Omega$cm, depending upon the NaCl content of the solution 24. The solution 24 is preferably applied to the semiconductor layer 16 in a liquid form, although it will be appreciated that any other suitable application form may also be used.

FIG. 6 illustrates the application of light energy 28 to the semiconductor layer 16 following the application of the solution 24. Where a transparent substrate layer 12 and a transparent base electrode layer 14 are used, the light energy 28 is applied through the substrate layer 12. Alternatively, an opaque substrate 12 and/or opaque base electrode layer 14 may be used, which requires light energy 28 to be applied through the solution 24 at the top surface 15 of the semiconductor layer 16. In a preferred embodiment of the invention, a tungsten-halogen lamplight is used as the source of light energy 28. It will be appreciated, however, that the light energy 28 can be supplied using any suitable source having sufficient intensity and spectrum for the light energy 28 to be absorbed into the semiconductor layer 16 and generate an electrochemical response between the solution 24 and the semiconductor layer 16. For proper absorption of the light energy into the semiconductor layer 16, the intensity of the light energy 28 is preferably within the range of from about 0.1 to about 5.0 sun, and is most preferably around 1.0 sun. A single (1.0) unit sun is the equivalent of 0.1 Watt/cm$^2$; therefore, the intensity of the light energy 28 may also be restated in alternative units as preferably within the range of from about 0.01 to about 0.5 Watt/cm$^2$, and most preferably around 0.1 Watt/cm$^2$.

FIGS. 5 through 7 illustrates the electrochemical response of the solution 24 and the semiconductor layer 16 with the application of light energy 28. FIG. 5 shows the solution 24 prior to the application of light energy 28 to the semiconductor layer 16. Prior to the application of light energy 28, the solution 24 contains a generally random distribution of the positive and negative ions. FIG. 6 shows the application of light energy 28 to the semiconductor layer 16. When the light energy 28 is applied to the semiconductor layer 16, photovoltage is generated in the semiconductor layer 16. This photovoltage enhances the areas of aberrant electric potential caused by the nonuniformities 23 at the top surface 15 of the semiconductor layer 16. The pronounced peaks and valleys in FIG. 6 illustrate this enhancement of the deviations of electric potential in the aberrant areas from the average electric potential of the remainder of the top surface 15 of the semiconductor layer 16.

The activation using light energy 28 to generate photovoltage in the semiconductor layer 16 causes an electrochemical reaction between the semiconductor layer 16 and the solution 24. As shown in FIG. 6, this electrochemical reaction causes the ions within the solution 24, which carry the bonding material, to redistribute and selectively bond the bonding material to the areas of aberrant electric potential caused by the nonuniformities 23 on the top surface 15 of the semiconductor layer 16. This bonding of the bonding material to the areas of aberrant electric potential can occur by any suitable bonding method, such as electropolymerization, etching, or double electric layer deposition, depending upon the chemical composition of the solution 24. FIG. 7 illustrates the net result of this electrochemical reaction. The redistribution of ions from the solution 24 causes a selective deposition of bonding material to the areas of aberrant electric potential caused by the nonuniformities 23 in the semiconductor layer 16. This selective deposition subsequently causes the average electric potential across the surface of the semiconductor layer 16 to normalize, or level out. The selectively deposited bonding material may also be characterized as either a resistive or a dipole "double electric" layer of material, as the deposited material functions similar to an electric capacitor by modifying the areas of weakened/increased electric potential to normalize the overall average surface photovoltage of the semiconductor layer 16.

The leveling of the surface photovoltage of the semiconductor layer 16 provides several advantages. A first advantage is an overall increase in PV cell efficiency, as the deposition of the bonding material blocks or passivates only those areas of aberrant electric potential coinciding with the nonuniformities 23 of the semiconductor layer 16. Another advantage is increased stability of the PV cell 10. By normalizing the surface photovoltage of the semiconductor layer 16, stresses caused by the nonuniformities 23 of the semiconductor layer 16 that normally lead to the nonuniform degradation of the PV cell 10 are minimized. The minimization of stresses caused by the nonuniformities 23 increases the stability and operational life of the PV cell 10.

Following the bonding of the bonding material to the top surface 15 of the semiconductor layer 16, the PV cell 10 is completed by the application of the conductive electrode layer 22. FIG. 7 illustrates the completed PV cell 10 including the conductive electrode layer 22. As previously discussed, generally only one of the base electrode layer 14 or the conductive electrode layer 22 is comprised of a transparent material. Therefore, where a transparent electrode material is used for the base electrode layer 14, the conductive electrode layer 22 is preferably formed from any suitable opaque, metallic material. However, where an opaque material is used for the base electrode layer 14, the conductive electrode layer 22 is then preferably comprised of any suitable transparent conductive material. Examples of such suitable transparent and opaque metallic materials include those materials previously discussed. Similarly, the application of the conductive electrode layer 22 may be achieved using any suitable application method, such as the application techniques previously discussed.

Figure 8:
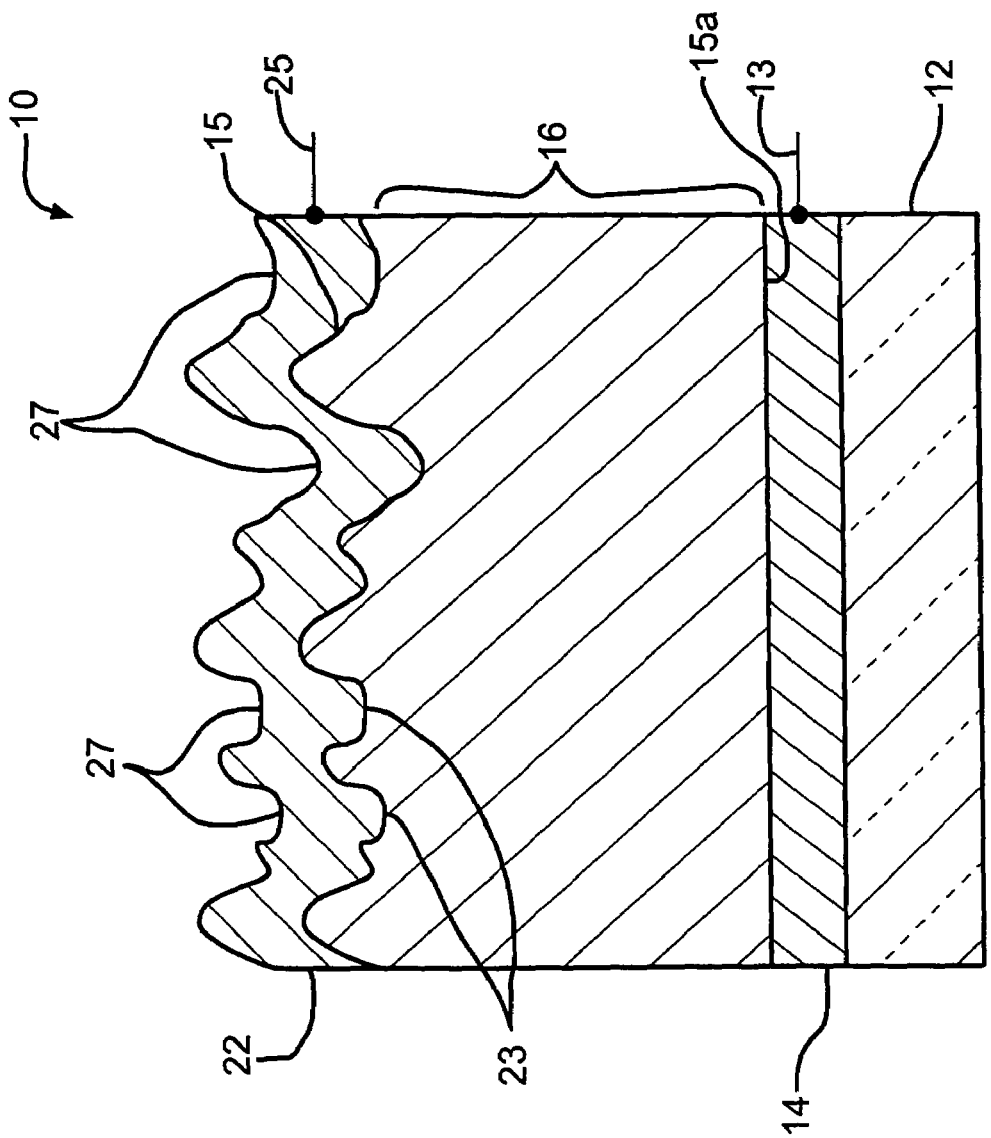
FIG. 8 is a schematic elevational view of a portion of a photovoltaic cell illustrating nonuniformities present in both the semiconductor layer and the transparent conductive electrode layer.

FIGS. 8 through 11 illustrate a second embodiment of the invention where treatment of the semiconductor layer 16 occurs after the application of the conductive electrode layer 22. The general configuration of the PV cell 10 for this embodiment is shown in FIG. 8. Where the semiconductor layer 16 is treated following the application of the conductive electrode layer 22, it is necessary that the conductive electrode layer 22 be composed of a transparent electrode material. Preferably, the transparent electrode material is a transparent conductive oxide material, such as fluorine-doped tin oxide (SnO$_2$:F), although any suitable transparent conductive oxide material may be used. A transparent material is necessary to allow the light energy 28 to penetrate the conductive electrode layer 22 and be absorbed into the semiconductor layer 16. Because the conductive electrode layer 22 is formed from a transparent electrode material, it is preferable that the base electrode layer 14 is composed of an opaque metallic material. It will also be appreciated that the substrate layer 12 may be formed from an opaque material as well, although a transparent material may also be used.

When the transparent conductive electrode layer 22 is applied to a semiconductor layer 16 having untreated surface nonuniformities 23, defect areas 27 corresponding to the nonuniformities 23 on the top surface 15 of the semiconductor layer 16 occur within the transparent conductive electrode layer 22. FIG. 8 illustrates the defect areas 27 of the transparent conductive electrode layer 22, which are generally characterized by areas of aberrant electric potential that deviate from the average electric potential of the remainder of the surface of the transparent conductive electrode layer 22. The defect areas 27 of the transparent conductive electrode layer 22 coincide with the underlying nonuniformities 23 of the semiconductor layer 16.

Figure 9:
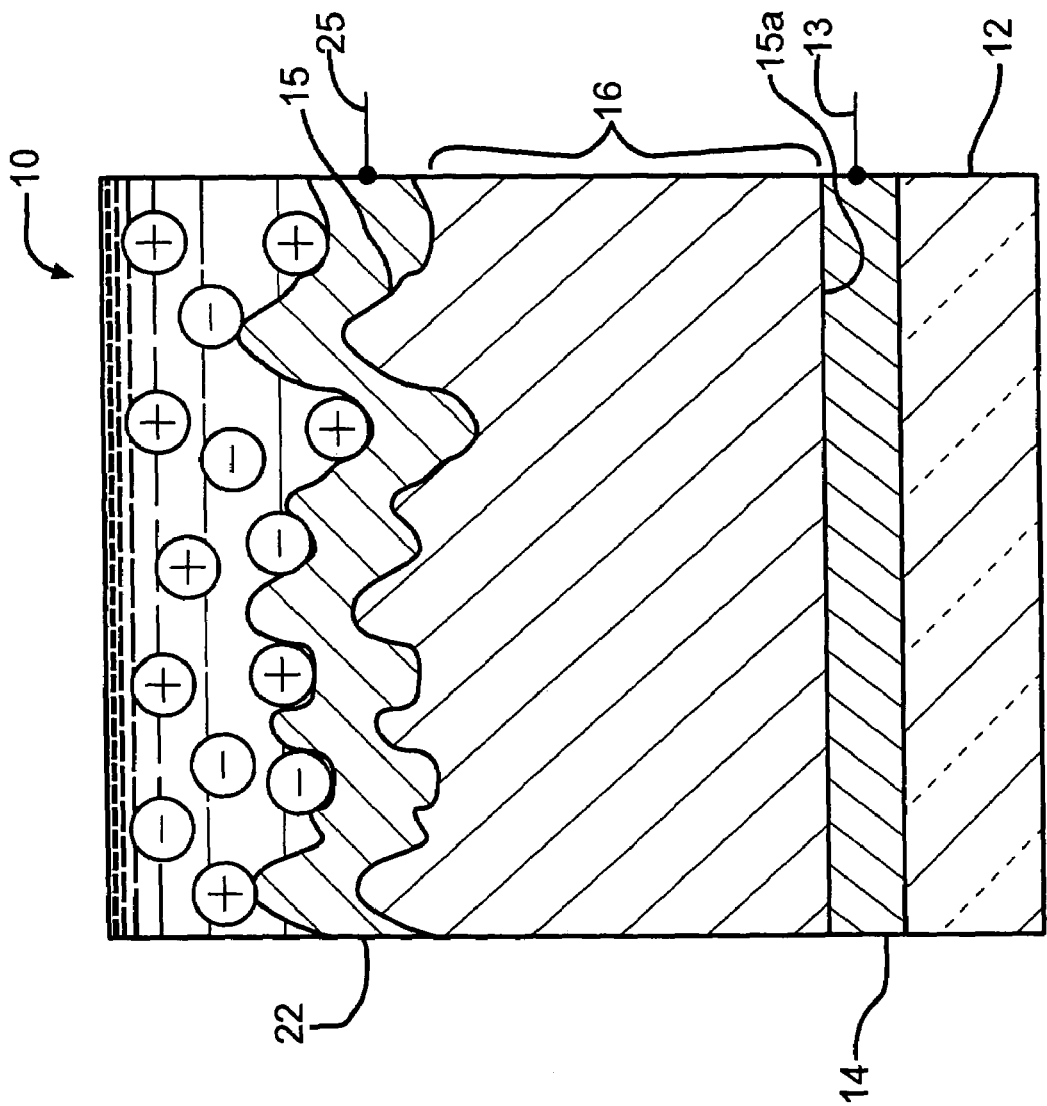
FIG. 9 is a schematic elevational view illustrating the application of a solution to the transparent conductive electrode layer in accordance with a second embodiment of the method of the present invention.

As shown in FIG. 9, a solution 24 containing an electrolyte and one or more bonding materials is applied to the transparent conductive electrode layer 22. The solution 24 preferably has the same chemical parameters and characteristics as the solution used in the first embodiment of the invention. The preferred chemical parameters and characteristics have been previously described in detail herein with respect to the first embodiment and may also be considered the requirements for the solution 24 used in this second embodiment of the invention.

Figure 10:
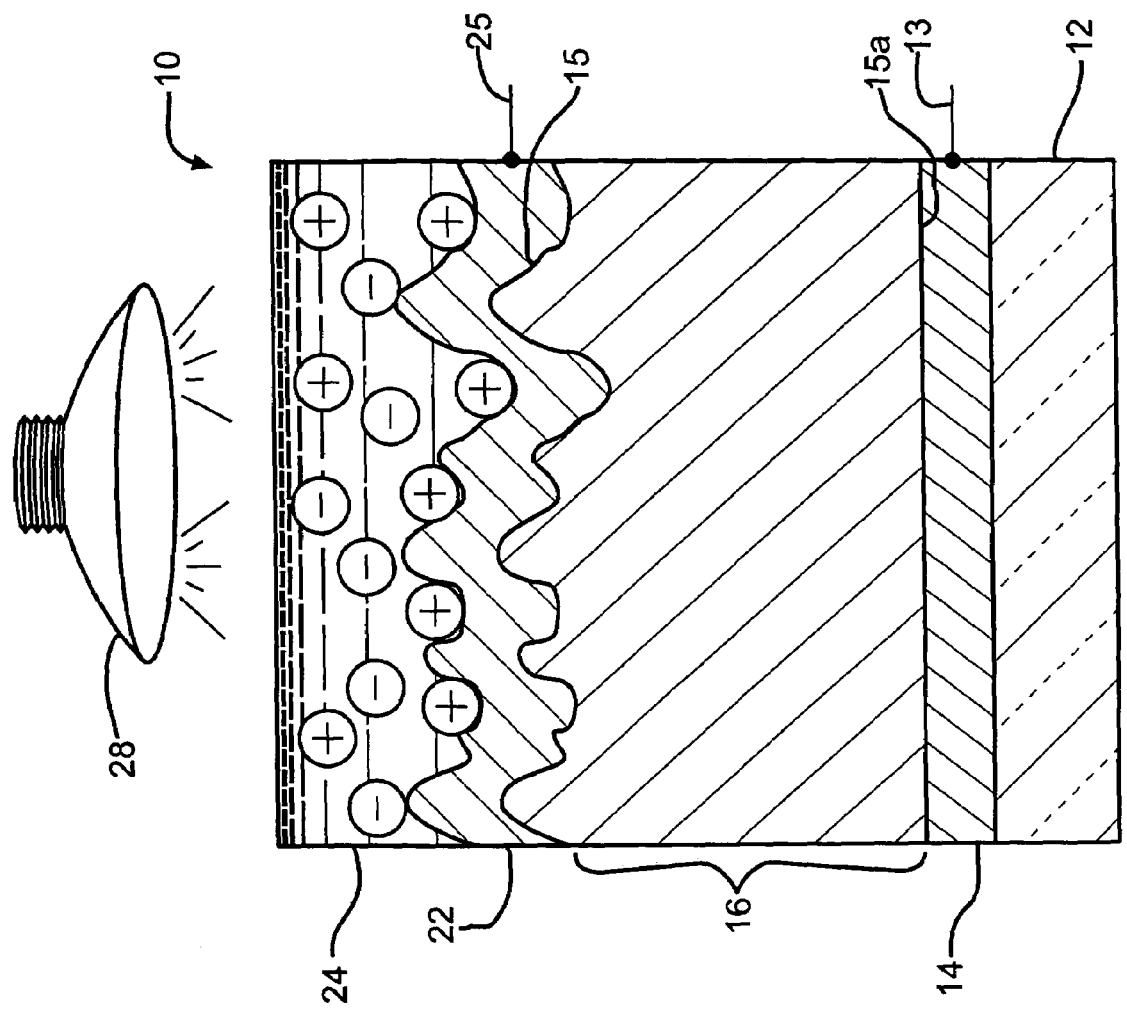
FIG. 10 is a schematic elevational view illustrating the application of light energy to the photovoltaic cell in accordance with a second embodiment of the method of the present invention.

FIG. 10 illustrates the application of light energy 28 to the transparent conductive electrode layer 22 following the application of the solution 24. In this embodiment, the light energy 28 is applied through the solution 24 placed on the surface of the transparent conductive electrode layer 22. The application of light energy 28 through the transparent conductive electrode layer 22 is required because, as previously discussed, generally one or both of the substrate layer 12 and the base electrode layer 14 are composed of an opaque material that prohibits the passage of light energy 28 through the opaque layer. The light intensity and spectrum requirements are the same as those required in the first embodiment of the invention, which have been described in detail herein.

Figure 11:
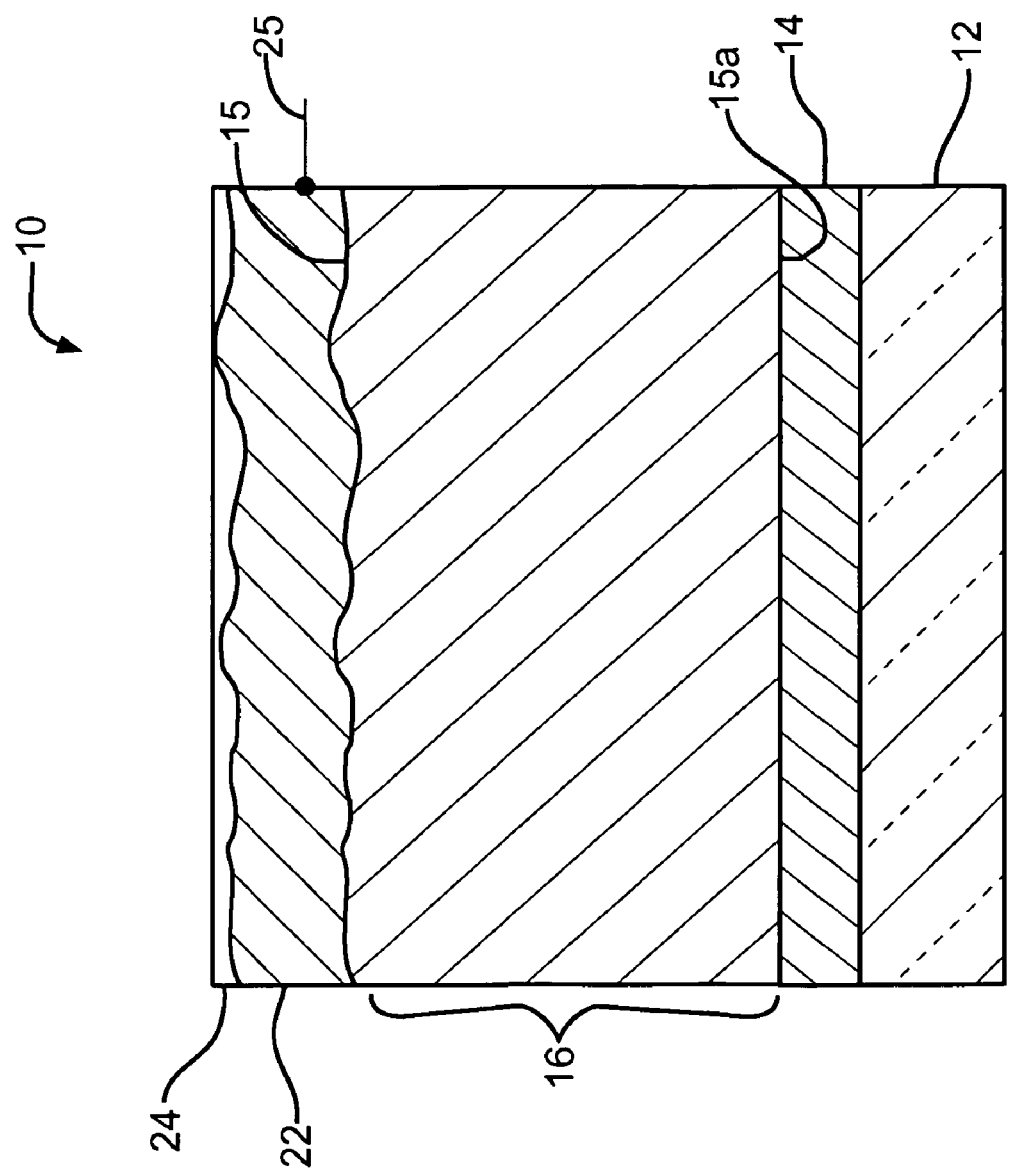
FIG. 11 is a schematic elevational view of a completed photovoltaic cell treated in accordance with a second embodiment of the method of the present invention.

FIG. 11 illustrates the selective deposition of the bonding material that occurs as a result of the electrochemical response between the solution 24 and the transparent conductive electrode layer 22. As in the first embodiment, when the light energy 28 is applied to the semiconductor layer 16, photovoltage is generated in the semiconductor layer 16. This photovoltage enhances the areas of aberrant electric potential caused by the nonuniformities 23 at the top surface 15 of the semiconductor layer 16, which subsequently results in defect areas 27 of aberrant electric potential within the transparent conductive electrode layer 22. The pronounced peaks and valleys in FIG. 10 illustrates this enhancement of the deviations of electric potential caused by the nonuniformities 23 of the semiconductor layer 16 that in turn result in the defect areas 27 of aberrant electric potential in the transparent conductive electrode layer 22.

The activation using light energy 28 to generate photovoltage in the semiconductor layer 16 causes an electrochemical reaction between the transparent conductive electrode layer 22 and the solution 24. As shown in FIG. 10, this electrochemical reaction causes the ions within the solution 24, which carry the bonding material, to redistribute and selectively bond the bonding material to the defect areas 27 of aberrant electric potential caused by the nonuniformities 23 on the top surface 15 of the semiconductor layer 16. This bonding of the bonding material to the areas of aberrant electric potential can occur by any suitable bonding method, such as electropolymerization, etching, or double electric layer deposition, depending upon the chemical composition of the solution 24. FIG. 11 illustrates the net result of this electrochemical reaction. The redistribution of ions from the solution 24 causes the selective deposition of material to the defect areas 27 of aberrant electric potential caused by the nonuniformities 23 in the semiconductor layer 16. This selective deposition subsequently causes the average electric potential across the surface of the transparent conductive electrode layer 22 to normalize, or level out. The selectively deposited bonding material may also be characterized as either a resistive or a dipole "double electric" layer of material, as the deposited bonding material functions similar to an electric capacitor by modifying the areas of weakened/increased electric potential to normalize the overall average surface photovoltage of the transparent conductive electrode layer 22.

The leveling of the photovoltage of the transparent conductive electrode layer 22 yields the same advantages of increased PV cell performance and increased stability and wear of the PV cell 10. Additionally, treatment of PV cell 10 following the application of the transparent conductive electrode layer 22 provides an additional advantage in that operational mode failure defects, or defects that arise subsequent to the manufacture of the PV cell 10, may also be treated.

The principle and mode of operation of this invention have been described in its preferred embodiments. However, it should be noted that this invention may be practiced otherwise than as specifically illustrated and described without departing from its scope.

What is claimed is:

1. A method of making a photovoltaic device comprising:
providing a substrate having a base electrode layer;
depositing a semiconductor layer onto the substrate layer, with a bottom surface of the semiconductor layer being deposited onto the base electrode layer, and a top surface of the semiconductor layer containing a plurality of nonuniformities, wherein the nonuniformities comprise areas of aberrant electric potential deviating from the average electric potential of the remainder of the top surface of the semiconductor layer;
applying a solution over the top surface of the semiconductor layer, wherein the solution is comprised of an electrolyte and at least one additional bonding material, and wherein the solution contains positive and negative ions;
applying light energy to the semiconductor layer to enhance the deviation in the electric potential of the aberrant electric potential areas, thereby causing a redistribution of the positive and negative ions of the solution, and also causing the bonding material to bond to the top surface of the semiconductor layer, wherein the resultant bonding is selective bonding of the bonding material to the areas of aberrant electric potential in a manner such that the electric potential of the nonuniformities is normalized relative to the average electric potential of the remainder of the top surface of the semiconductor layer; and
depositing a conductive electrode layer over the top surface of the semiconductor layer.

2. The method of claim 1 wherein the positive and negative ions include a non-ionic bonding material carried with the positive and negative ions of the solution.

3. The method of claim 1 wherein the bonding of the bonding material to the nonuniformities occurs by any one of electropolymerization, etching, or double electric layer deposition.

4. The method of claim 1 wherein the solution includes a combination of an aniline material, p-toluenesulphonic acid, and NaCl in a deionized water base.

5. The method of claim 1 wherein the solution has sufficient resistivity to cause the redistribution of the positive and negative ions of the solution.

6. The method of claim 5 wherein the resistivity of the solution is within the range of from about 0.1 to about 2000 Ωcm.

7. The method of claim 1 wherein the substrate layer is formed from a transparent material and the base electrode layer is formed from a transparent conductive electrode material.

8. The method of claim 7 wherein the conductive electrode layer is formed from an opaque metallic material.

9. The method of claim 7 wherein the light energy is applied to the device through the substrate layer.

10. The method of claim 7 wherein the transparent conductive electrode material is a transparent conductive oxide.

11. The method of claim 1 wherein the base electrode layer is formed from an opaque metallic material.

12. The method of claim 11 wherein the conductive electrode layer is formed from a transparent conductive electrode material.

13. The method of claim 11 wherein the light energy is applied to the device through the solution applied to the top surface of the semiconductor layer.

14. The method of claim 1 in which the source of light energy is a tungsten-halogen lamp light.

15. The method of claim 1 wherein the intensity and spectrum of the light energy is sufficient to be absorbed into the semiconductor layer of the device and cause the redistribution of the positive and negative ions of the solution.

16. The method of claim 15 wherein the intensity of the light energy is within the range of from about 0.1 to about 5.0 sun.

17. A method of making a photovoltaic device comprising:

providing a substrate having a base electrode layer;

depositing a semiconductor layer onto the substrate layer, with a bottom surface of the semiconductor layer being deposited onto the base electrode layer, and a top surface of the semiconductor layer containing a plurality of nonuniformities, wherein the nonuniformities comprise areas of aberrant electric potential deviating from the average electric potential of the remainder of the top surface of the semiconductor layer;

depositing a transparent conductive electrode layer over the top surface of the semiconductor layer, the transparent conductive electrode layer containing a plurality of defect areas corresponding to the nonuniformities of the semiconductor layer, wherein the defect areas comprise areas of aberrant electric potential deviating from the average electric potential of the remainder of the transparent conductive electrode layer;

applying a solution over the transparent conductive electrode layer, wherein the solution is comprised of an electrolyte and at least one additional bonding material, and wherein the solution contains positive and negative ions; and applying light energy to the semiconductor layer to enhance the deviation in the electric potential of the aberrant electric potential areas of the semiconductor layer and the transparent conductive electrode layer, thereby causing a redistribution of the positive and negative ions of the solution, and also causing the bonding material to bond to the top surface of the transparent conductive electrode layer, wherein the resultant bonding is selective bonding of the bonding material to the areas of aberrant electric potential of the transparent conductive electrode layer in a manner such that the electric potential of the defect areas is normalized relative to the average electric potential of the remainder of the transparent conductive electrode layer.

18. The method of claim 17 wherein the positive and negative ions include a non-ionic bonding material carried with the positive and negative ions of the solution.

19. The method of claim 17 wherein the bonding of the bonding material to the defect areas occurs by any one of electropolymerization, etching, or double electric layer deposition.

20. The method of claim 17 wherein the solution includes a combination of an aniline material, p-toluenesulphonic acid, and NaCl in a deionized water base.

21. The method of claim 17 wherein the solution has sufficient resistivity to cause the redistribution of the positive and negative ions in the solution.

22. The method of claim 21 wherein the resistivity of the solution is within the range of from about 0.1 to about 2000 Ωcm.

23. The method of claim 17 wherein the light energy is applied through the solution placed over the transparent conductive electrode layer.

24. The method of claim 17 in which the source of light energy is a tungsten-halogen lamp light.

25. The method of claim 17 wherein the intensity and spectrum of the light energy is sufficient to be absorbed into the semiconductor layer of the device and cause the redistribution of the positive and negative ions of the solution.

26. The method of claim 25 wherein the intensity of the light energy is within the range of from about 0.1 to about 5.0 sun.

27. The method of claim 17 wherein the transparent conductive electrode layer is formed from a transparent conductive oxide material.

28. The method of claim 17 wherein the base electrode layer is formed from an opaque metallic material.

* * * * *